United States Patent [19]

Dixon et al.

[11] Patent Number: 4,479,990
[45] Date of Patent: Oct. 30, 1984

[54] ARC AND TRACK RESISTANT ARTICLES UTILIZING PHOTOSENSITIVE SAG RESISTANT CYCLOALIPHATIC EPOXY RESIN COATING COMPOSITIONS

[75] Inventors: George D. Dixon, Needham, Mass.; Howard E. Saunders, Murrysville, Pa.; Smith A. Gause, Hampton, S.C.; Newton N. Goldberg, Penn Hills Township, Allegheny County, Pa.

[73] Assignee: Westinghouse Electric Co., Pittsburgh, Pa.

[21] Appl. No.: 403,441

[22] Filed: Jul. 30, 1982

[51] Int. Cl.³ .................. C08K 3/10; C08L 63/00; H01B 3/40
[52] U.S. Cl. ............................ 428/36; 428/413; 523/414; 523/457; 523/466; 525/449; 525/533; 204/159.14
[58] Field of Search ............ 523/457, 414, 466; 204/159.14; 525/449, 533; 428/36, 35

[56] References Cited

U.S. PATENT DOCUMENTS

| 3,449,274 | 6/1969 | Salensky | 523/466 |
| 3,505,426 | 4/1970 | Matsumoto et al. | 525/449 |
| 3,817,906 | 6/1974 | Tsukioka et al. | 523/440 |
| 3,828,000 | 8/1974 | Luck et al. | 523/457 |
| 3,937,855 | 2/1976 | Gruenwald | 427/342 |
| 4,020,306 | 4/1977 | Zahner et al. | 523/457 |
| 4,102,851 | 7/1978 | Luck et al. | 523/457 |
| 4,104,238 | 8/1978 | Chenoweth et al. | 523/466 |
| 4,206,066 | 6/1980 | Rinehart | 523/457 |
| 4,404,355 | 9/1983 | Eldin et al. | 525/507 |
| 4,412,048 | 10/1983 | Dixon et al. | 204/159.14 |

OTHER PUBLICATIONS

Derwent Abst. 80181V/46, (10–1974), J74038717.
Derwent Abst. 80182V/46, (10–1974), J74038718.

Primary Examiner—Herbert J. Lilling
Attorney, Agent, or Firm—D. P. Cillo

[57] ABSTRACT

A photosensitive sag resistant composition is made containing cycloaliphatic epoxy resin, a flexibilizing agent, arc and track resistant filler, thixotroping agent, and an amount of a photosensitive compound effective to initiate gelation with ultraviolet light exposure, where the composition is resistant to sag upon application to a surface, and has chemical and physical resistance to arced $SF_6$ upon cure.

20 Claims, No Drawings

ARC AND TRACK RESISTANT ARTICLES UTILIZING PHOTOSENSITIVE SAG RESISTANT CYCLOALIPHATIC EPOXY RESIN COATING COMPOSITIONS

BACKGROUND OF THE INVENTION

To persons skilled in the art of the transmission of electrical power at high voltages, it is known to provide the transmission lines with power circuit breakers. These are structures of substantial size, being on the order of 10 to 20 feet tall and having, in the vicinity of their tops, electrically insulated and supported contacts that may be rapidly opened whenever an overload or fault occurs on the transmission line being protected by such breaker. When the contacts of such a power circuit breaker are opened, an arc results, and it is naturally desirable that the arc be extinguished as quickly as possible in order to avoid damage to the circuit breaker. Moreover, with voltages as high as 750 kilovolts, the arc may be several inches long, or even as long as a few feet.

It has become customary in certain designs to provide the contact area of a power circuit breaker with a flow of sulfur hexafluoride. Sulfur hexafluoride ($SF_6$) is a gas at room temperature and atmospheric pressure, and it is chemically rather inactive. It has a dielectric value substantially higher than that of air, so that an electric arc therein not only tends to be smaller, i.e., more filamentary, but also to decay and be extinguished substantially more rapidly.

However, an electric arc causes degradation of sulfur hexafluoride into chemical entities that are extremely reactive, such as positively or negatively charged fluorine atoms and the like. These chemical entities are capable of abstracting hydrogen from molecules having an O-H bond or other active hydrogens, to form hydrogen fluoride, which is extremely reactive to many insulating materials. The reactivity of arced sulfur hexafluoride is aggravated by the presence of moisture, and moisture cannot always be completely excluded from the vicinity of the contacts of a power circuit breaker.

In building power circuit breakers of the kind protected with sulfur hexafluoride, it has been customary to lead the $SF_6$ gas from a compressor and high-pressure reservoir through a feed tube, wherein the $SF_6$ gas is under pressure of about 250 pounds per square inch, to the vicinity of the contacts, where $SF_6$ gas is maintained at a lower pressure such as 50 pounds per square inch. The feed tube may be visualized as a simple cylindrical tube, about 12 feet long, 3 inches in outside diameter, and 1/4 inch in wall thickness. It had been customary to make such feed tubes by coating a sheet of paper on one or both sides with resin, and rolling the paper to form the feed tube. Modern design provides for coating the resin on a steel mandrel, and curing the resin to form a feed tube liner. This is followed by wrapping resin coated glass fabric or filaments on the liner, to form the feed tube.

The development of a satisfactory feed tube liner for use in power circuit breakers of the kind using $SF_6$ involves more than just finding a material that is chemically resistant to the reactive entities present in arcing $SF_6$. A resinous material for this purpose must also be reasonably convenient to handle, must cure without sag drainage so as to provide straight, uniform liners, and it must also possess adequate arc and track resistance.

Sag resistant coatings for feed tube liners, useful in atmospheres of moist, pressurized sulfur hexafluoride insulating gas, found in many extra-high-voltage power circuit breakers, are known in the art, and taught by Luck et al. in U.S. Pat. No. 3,828,000. Such coatings, however, were made from filled, flexibilized, cycloaliphatic epoxy resin compositions utilizing asbestos filler as a critical thickening agent. However, the use of asbestos-containing materials has been severely curtailed in industry because of potential health hazards.

Polyester resins, vacuum pressure impregnated into the interstices of electrical coil wrappings have been quick gelled, to prevent resin drainage from the wrapping interior, by ultraviolet irradiation for a two minute period before final 125° C. to 165° C. cure, as taught by Gruenwald, in U.S. Pat. No. 3,937,855. However, as taught by Luck et al., in U.S. Pat. No. 4,102,851, polyesters are not generally chemically resistant to arced sulfur hexafluoride that might be found during overload of an extra-high-voltage power circuit breaker.

Additionally, Luck et al., in U.S. Pat. No. 4,102,851, teaches that bisphenol A epoxy resins, polyurethane resins, polyamide resins, polyphenylene oxide resins, silicone resins, phenolic resins, and many other materials, would not be useful in circuit breaker feed tube liners, or other coated breaker articles. It had always been thought that resin modification of the cycloaliphatic epoxy base resin used to make feed tube liners, would produce disastrous results in an arced $SF_6$ environment. Luck et al. solved the asbestos problem, not by resin modification, but by substituting finely divided aluminum oxide filler for the asbestos filler in the prior flexibilized, cycloaliphatic epoxy resin compositions. However, asbestos had unique thickening properties difficult to duplicate, and some sag problems may still result when the feed tube liner or other coated circuit breaker article is heat cured at 130° C. to 140° C.

There has been a long felt need then, for sag resistant coating compositions that do not contain toxic materials and which are adequately arc and track resistant in the presence of moist, pressurized, arced sulfur hexafluoride gas.

SUMMARY OF THE INVENTION

We have found, that in accordance with the invention, the above-indicated problems are overcome by providing a sag resistant composition, having at least one component that is photosensitive to ultraviolet radiation, comprising an admixture of the following: (1) a coating composition comprising (A) an epoxy resin of the kind having a backbone structure characterized by at least one, and preferably two substantially cycloaliphatic rings, and in the case of structures comprising a pair of rings and having a bridge therebetween, preferably a resin of the kind having not more than about 5 atoms in the direct chain from one ring to the other; (B) a flexibilizing agent preferably comprising polyazelaic polyanhydride, alone or with hexahydrophthalic anhydride; (C) a filler promoting arc and track resistance, such as, preferably, aluminum trihydrate or naturally occurring magnesite; (D) a thixotroping agent, preferably finely divided aluminum oxide (alumina $Al_2O_3$) particles having a large surface area and an average particle size range of between about 0.5 milli-micron ($m\mu$) to about 100 milli-microns ($m\mu$) diameter; with (2) an amount of a photosensitive compound effective to render the admixture sensitive to irradiation with ultraviolet (U.V.) light and initiate gelation within the admixture, without drastically harming the chemical and physical arc and track resistant properties of the cured sag resistant composition. The admixture is resistant to sag upon application to a surface, and is resistant to arced $SF_6$ upon cure.

The photosensitive compound may consist solely of, for example, a cationic type photoinitiator, such as an aryl diazonium salt; or it may contain a photoinitiator mixed with a carrier, for example, a polyester resin or a trifunctional acrylate resin containing benzoin ether or other suitable free radical type photoinitiator. The term "photosensitive compound" is herein defined as a compound comprising, i.e., containing at least, a photoinitiator. Unexpectedly, the inclusion of acrylates and other useful carriers, such as aromatic ester non-reactive plasticizers, polyesters, acrylourethanes, or polythiolene resins, within limited amounts effective to cause gelation of the admixture, did not add substantially to the cured admixture's degradation in an arced $SF_6$ environment, as long as sufficient arc and track resistant filler was used.

When the above components are mixed, for example, in such proportions as 100 parts by weight of resin, about 100 parts by weight of polyazelaic polyanhydride, about 220 parts by weight of aluminum trihydrate, about 10 parts to about 75 parts by weight of alumina, alone or with a suitable catalyst or accelerator, and, for example, 2.5 parts by weight based on 100 parts of all the other materials, of a trifunctional acrylate containing 4% by weight of benzoin ether photoinitiator, there is obtained a viscous liquid that can be used to overcome the problems indicated hereinbefore.

More particularly, this viscous, photosensitive, sag resistant composition itself or thinned with suitable organic solvents, is applied to objects and cured. A particular example involves making a power circuit breaker feed tube by applying the viscous liquid of this invention to a mandrel, causing it to gel by irradiation with U.V. light for about 1 to 15 seconds, heat curing, wrapping resin-wet glass fiber therearound, curing, grinding the outside diameter to size, optionally applying additional amounts of the viscous liquid to the sized exterior, and again curing.

Other applications of this photosensitive composition can include lining materials for $SF_6$-filled power circuit breakers, coatings to protect high voltage epoxy post or other insulators which are used as insulating conductor support structures in $SF_6$-filled gas insulated high voltage and/or transmission systems, and as protective coating compositions for glass cloth epoxy and other type circuit boards and insulator structures.

DESCRIPTION OF THE PREFERRED EMBODIMENTS

In accordance with the invention, there is compounded a photosensitive composition comprising an appropriate resin, a flexibilizing agent, a filler, high surface area, finely divided, highly dispersed thickener or thixotroping agent, and a photosensitive compound. The admixture may also contain, if desired, a catalyst or a reaction accelerator that participates in the curing reaction.

The epoxy resin selected is substantially cycloaliphatic and is preferably of the kind having a backbone structure comprising a pair of cycloaliphatic rings joined by a bridge, with epoxy oxygen atoms disposed between vicinal ones of the carbon atoms comprising the cycloaliphatic rings. The cycloaliphatic resins are used in place of the other known kinds of epoxy resins, such as the ones of aromatic character, based upon a bisphenol, or the epoxidized novalac resins. The resins of cycloaliphatic character appear to yield compositions having the desired flexibility, chemical inertness, and resistance to surface arcing, whereas tests with epoxy resins of the other kinds mentioned above tended generally to yield results that were deficient with respect to one or more of the above-mentioned properties.

Useful cycloaliphatic resins include, for example, those having a backbone structure that comprises two cycloaliphatic rings joined by a bridge structure, such as either

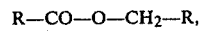

R—CO—O—CH$_2$—R, or

R—CH$_2$—O—CO—(CH$_2$)$_4$—CO—O—CH$_2$—R, where the former type is preferred, i.e., a cycloaliphatic epoxy resin that has a bridge between its rings that does not contain more than about 5 atoms in the direct chain between the rings. In the structures above, R is a cycloaliphatic ring, preferably but not necessarily a 6-membered aliphatic ring, having an epoxy oxygen atom connected to a pair of vicinal carbon atoms.

Other useful cycloaliphatic epoxy resins include, for example, 2,3-epoxy cyclopentane-4,7-endomethylene cyclohexane-6-glycidyl ether; diglycidyl ester of tetrahydrophthalic anhydride; diglycidyl ether of hexahydrophthalic anhydride; di-(epoxy cyclopentane) ethers, and the like, where these examples are meant to be illustrative and not limiting. For a detailed structural description of these and other useful cycloaliphatic epoxy resins, reference may be made to U.S. Pat. No. 4,102,851, herein incorporated by reference.

One hundred parts by weight of the cycloaliphatic epoxy resin described above are mixed with 30 to 150 parts by weight of a flexibilizing agent comprising polyazelaic polyanhydride, preferably having a molecular weight of from 2,100 to 2,500, and/or hexahydrophthalic anhydride. There may be used, for example, 100 parts by weight of the polyazelaic polyanhydride; or 95 parts by weight of the polyazelaic polyanhydride and 10 or 15 parts of the hexahydrophthalic anhydride. As a flexibilizing agent, the latter is less effective than the former. When the coating composition lacks an adequate proportion of effective flexibility agent, cracking develops when the cured composition is subjected to a thermal cycling test. On the other hand, coating compositions that contain too great an amount of flexibilizing agent, while satisfactory in the thermal cycling test, tend to exhibit poor or unsatisfactory results in a chemical attack test comprising exposure to arced $SF_6$ gas. In some instances, especially when the base cycloaliphatic epoxy resin is itself particularly flexible, hexahydrophthalic acid may be used alone.

The coating composition further comprises aluminum trihydrate ($Al_2O_3.3H_2O$) or naturally occurring magnesite ($MgCO_3$) or their mixtures, preferably the former, for use solely as a filler promoting arc and track resistance in moist $SF_6$ gas. There may be used, per 100 parts of cycloaliphatic epoxy resin, about 150 to about 290 parts, preferably 200 to 250 parts by weight, of such material, having an average particle size of between about 0.5 micron and about 450 microns. Without a sufficient amount of aluminum trihydrate, the arc and track resistance in moist $SF_6$ gas is poor.

The trihydrate has the further attribute that it is sufficiently basic in character that, in addition to serving the purpose mentioned above, it also is capable, when the mixture is subjected to curing conditions hereinafter mentioned, of promoting the usual intermolecular cross-linking between the epoxy oxygen atoms of the resin that characterizes such curing. Those skilled in the art of working with epoxy-resin compositions will appreciate that such curing is customarily promoted with the use of an agent of fairly strongly acidic or basic character. When the magnesite is used, it becomes necessary to use, for one example, benzyldimethylamine as the catalyst to promote the curing reaction.

The coating composition further comprises, for 100 parts of cycloaliphatic epoxy resin, from about 10 to about 75 parts of finely divided, highly dispersed aluminum oxide (alumina $Al_2O_3$) having an average particle size range of between about 0.5 milli-micron (0.0005 micron) and about 100 milli-microns (0.100 micron) diameter, preferably between about 2 milli-microns and about 50 milli-microns diameter, and a high area, used solely as a thixotroping agent. This is to be distinguished from aluminum trihydrate described above, which has a much larger particle size, a different chemistry, and serves a completely different function in this invention. In the invention, the use of the aluminum oxide material as a satisfactory thixotroping agent or thickener is very important. Without a thixotroping agent, the filler tends to settle out when the composition is used for casting or potting, and when the composition is used for spray or dip casting, the thixotroping agent is needed in order to help prevent the coating from dripping off the coated piece. Below about 0.5 milli-micron diameter, the thixotropic effect becomes too pronounced and coating is difficult. Over about 100 milli-microns diameter, the coating may tend to drip.

The preferred surface area range for useful alumina materials for this invention is from about 40 sq.m/g to 300 sq.m/g (BET) with a pH between about 3.5 to 9 (4% aqueous dispersion). This high surface area is believed to be partly responsible for the excellent thickening ability of this material. This material is usually made by the combustion of appropriate mixtures of aluminum trichloride, hydrogen and oxygen, to form in the resulting flame front an alumina fume or alumina soot-like material possessing extremely high surface area per unit weight.

The sag resistant composition finally comprises, as an essential ingredient added to the base coating composition, a photosensitive compound added in an amount effective to render the admixture extremely sensitive to irradiation with ultraviolet (U.V.) light under room temperature conditions, and initiate polymerization within the admixture, so that gelation can occur in a matter of a few seconds, i.e., essentially instantaneously. Such instantaneous gelation is essential, because the composition is usually applied to the surface of a cylindrical steel mandrel, from which dripping or sag of the composition can occur quite easily and quickly, since neither impregnation nor a porous surface is involved.

The photosensitive compound, hereinbefore defined, can be either a cationic type photoinitiator which is effective alone to cause gelation of a portion of the base cycloaliphatic epoxy resin and thus the composition; or a mixture of photoinitiator and a selected carrier, where the photoinitiator causes gelation of the carrier to an extent sufficient to substantially increase the viscosity of the admixture, without substantial harm of the arc and track resistant properties of the cured composition. The amount of carrier that can be tolerated without harm to arc and track properties will vary depending on the type of carrier.

Cationic photoinitiators, such as aryl diazonium salts, aryl iodonium salts, aryl sulphonium salts, and the like, well known in the art, can be used alone to cause coating composition gelation; when added to the other components, in an effective range of from 0.05 part by weight to 3.0 parts by weight, based on 100 parts of the other ingredients, i.e., cycloaliphatic epoxy resin, flexibilizing agent, arc and track resistant filler, and aluminum oxide thickener. Additionally, the cationic photoinitiator can be added to well-known non-reactive plasticizers, such as, for example, aromatic esters such as di alkyl phthalates, aromatic phosphates such as tri phenyl phosphate, and the like, in an effective range of from about 20 wt. % to about 70 wt. %, to provide a photosensitive compound, which can be added to the other ingredients in an effective range of from 1.0 part by weight to 15 parts by weight, based on 100 parts of other ingredients constituting the coating composition.

Other photoinitiators cannot be used alone, and must be added to resinous carriers which are useful in combination with the base cycloaliphatic epoxy resin. Examples of such resinous carriers include acrylates, acrylourethanes, polyesters and polythiolenes. None of these are as compatible with track resistant properties as aromatic esters, notably the acrylics and polyesters, and must be added in lesser quantities. When mono, di, or tri acrylates, such as, for example 2-hydroxyethyl acrylate, or methyl methacrylate, hexanediol diacrylate and trimethylol propane triacrylate, respectively are used as the resinous carrier, or when acrylourethane resins, polythiolene resins or polyester resins are used as the resinous carrier, typical, well known, free radical types of photoinitiators can be added to provide photosensitive compounds. Examples of free radical type photoinitiators would include, for example, benzophenone, diethoxyacetophenone, benzoin methyl ether, benzoin ethyl ether, benzoin isopropyl ether, benzoin isobutyl ether, diethoxyxanthanone, chlorothio-xanthanone, azo-bis-isobutyronitrile, their mixtures, mixtures of N-methyl diethanolaminebenzophenone, and the like.

Free radical photoinitiators can be added to an acrylic resin carrier in an effective range of from about 0.05 wt. % to about 15 wt. %, to provide a photosensitive compound, which can then be added to the other ingredients in an effective range of from 1.0 part by weight to 4.0 parts by weight, based on 100 parts of the other ingredients constituting the coating composition. Free radical photoinitiators can also be added to a polyester resin carrier in an effective range of from about 0.05 wt. % to about 15 wt. %, to provide a photosensitive compound, which can then be added to the other ingredients in an effective range of from 1.0 part by weight to 3.0 parts by weight, based on 100 parts of the other ingredients constituting the coating composition. Free radical photoinitiators can also be added to an acrylourethane resin carrier, an acrylated urethane oligomer consisting of hydroxy acrylates and isocyanates with polyester, polyol or diamine chain extension, in an effective range of from about 0.05 wt. % to about 15 wt. %, to provide a photosensitive compound, which can then be added to the other ingredients in an effective range of from 1.0 part by weight to 5.0 parts by weight, based on 100 parts of the other ingredients constituting the coating composition. Free radical photoinitiators can additionally be added to a polythiolene resin carrier, consisting of a mixture of polythiols and polyenes, in an effective range of from about 0.05 wt. % to about 15 wt. %, to provide a photosensitive compound, which can then be added to the other ingredients in an effective range of from 0.05 part by weight to 8.0 parts by weight, based on 100 parts of the other ingredients constituting the coating composition.

In all cases, under the minimum parts by weight of photosensitive compound, gelation is ineffective and sagging results. Over the maximum parts by weight of photosensitive compound, track resistance of the cured composition admixture will be adversely affected. Within the useful ranges, the photosensitive compound is effective to cause gelation without adversely affecting track resistant properties. The materials, used as carriers are well known in the art, and reference may be made to Plastics Materials, J. Brydson, D. Van Nostrand, 1966, Chapters 12, and 21, for general descriptions of acyrlic, and polyester resins respectively. Reference may be made to U.V. Curing: Science and Technology, S. P. Pappas ed., Technology Marketing Corp., 1978, p. 167, for a general description of acrylourethane resins, and J. Polym. Sci., Vol. 15, 1977, p. 627, for a general description of polythiolene resins. A detailed description of non-reactive platicizers can be found in The Technology of Solvents and Plasticizers, Doolittle, John Wiley and Sons, 1954, Chapters 15 and 16.

The foregoing are the essential ingredients of the sag resistant composition, but it may also contain other ingredients, such as catalysts, participating reaction accelerators, fireproofing agents, flame-retardants, dyes, pigments, or other coloring agents, etc.

As a catalyst for the curing reaction, if one is used, it is preferred to use benzyldimethylamine. Most of the other known catalysts for curing epoxy resins have the drawback that they worsen the performance of the composition in arced $SF_6$ gas. One can use, for example, about 0.5 part to about 2 parts by weight of the amine per 100 parts of cycloaliphatic epoxy resin.

As a participating reaction accelerator, one can use, in some instances, a mixture of sodium alcoholate suspended in polyol. This material cannot be used when magnesite is used in place of aluminum trihydrate, since it reacts with the magnesite instead of with the resin molecules. When used with compositions containing aluminum trihydrate, the material is added in quantities of about 10 parts to about 15 parts by weight per 100 parts of cycloaliphatic epoxy resin.

The above ingredients are all thoroughly mixed at about 50° C. to 60° C. A viscous sag resistant, photosensitive, thixotropic liquid results. This may be used as such, or it may be thinned with an appropriate organic solvent, such as toluene, benzene, acetone, ethanol, petroleum ether, diethyl ether, or the like, depending upon the manner of intended use.

The use of the composition will be described with reference to the making of a feed tube for an extra-high-voltage power circuit breaker of the type utilizing $SF_6$ gas. Such types are cylindrical, about 3 inches in diameter and about 12 to 16 feet long, with a wall thickness of about ¼ to ½ inch. Embedded therein are filament wound reinforcing fibers such as rayon or cotton thread, glass cloth, polyester or aramid fibers, and the like.

One way of making a feed tube is to dilute the composition with solvent, warm it slightly, spray it onto a mold-release-coated mandrel, gel the coating composition by subjecting it to a bank of U.V. light sources while spraying, such as a bank of medium pressure mercury or pulsed xenon lamps, heat the coating composition at about 135° C. for 3 to 6 hours to cure and form a feed tube liner, wind resin-wet glass filaments, cure, withdraw the mandrel, grind the outside diameter to size, optionally spray the exterior of the tube with the coating composition and finally cure.

The mechanism by which the photosensitive compound additive gels the base coating composition, involves cationic photoinitiation of cycloaliphatic resin by U.V. radiation, to provide a chain matrix shell of linked polymer on the outside surface of the coating effective to contain the rest of the resin and prevent sagging. When free radical photoinitiators are used, U.V. radiation causes photoinitiation of the carrier resin, such as acrylic resin, to also provide a chain matrix shell effective to contain the rest of the cycloaliphatic resin, until final heat curing solidifies the entire coating thickness.

The invention described is illustrated by the specific examples hereinbelow, in connection with which there are given data resulting from the FTT Test.

In the Feed Tube Track Test (FTTT), a 3-inch long section of arc and track resistant lined tube, 3 inches in diameter, about 5/16 inch thick, containing, on its inside cylindrical surface, an attached Teflon section having a flat test surface 1 inch wide, is used. Samples to be tested are cut to 2 inch×1 inch×0.10 inch dimensions, and mounted on the test surface by spring electrodes. The ends of the feed tube section are closed by means of inch-thick plates of polycarbonate resin containing proper openings and fittings. Electrodes made of 0.032-inch Nichrome wire are disposed against the test sample, one inch apart. The tube is then positioned at an angle 45° with respect to the horizontal and is charged with $SF_6$ gas to 240 p.s.i.g. To the upper end of the tube, there is fed, at a rate of 0.02 cubic centimeter per minute, water that contains 0.1% of a non-ionic wetting agent and has a resistivity of 4 kilo-ohms per centimeter, this water flowing over the surface of the sample, to "connect" the electrodes. After the water has flowed from one electrode to the other for 5 minutes, a 5 kilovolt potential is applied across the electrodes. Scintillations slowly start and play across the test sample surface. The test continues for 10 minutes, unless the test sample surface fails before that time, for example, by developing a carbon track or an overall electrical resistance low enough that the current between the electrodes rises to 20 milliamperes. In either event, the current will rise sufficiently to activate a relay set for 20 milliamperes. The results of this test are reported in number of seconds duration of test. An early industry phenolic feed tube fails in this test in less than 12 seconds, and on the average, in less than 4 seconds tracking is observed.

EXAMPLE 1

Five sample compositions were made, and portions of each were poured into 2-inch diameter aluminum dishes to give a thickness of approximately 0.1 inch. Samples 1 to 3 and comparative Sample 4 contained photosensitive compounds and were irradiated with U.V. light in the form of two, 200 watt/inch medium pressure mercury lamps, for about 2 seconds to cause gelation. This was followed by a ½ hour heating cycle in an oven at 135° C., after which the dishes were turned over and the composition was checked for sagging. After a 4 hour cure at 135° C., track resistance measurements were taken using the FTTT method described hereinbefore. Comparative Sample 5 did not contain a photosensitive compound. It was heated for ½ hour in an oven at 135° C., checked for sagging, cured for 16 hours at 135° C. and measured for track resistance. In all cases, the cured samples were cut to 2 inch×1 inch for FTTT measurements.

SAMPLE 1

Sample 1 contained 100 grams of cycloaliphatic epoxy resin, having a viscosity at 25° C. of 350 cps. to 450 cps., and an epoxide equivalent weight of 126 to 140 (sold by Union Carbide Chemical Co. under the trade name ERLA 4221); 97 grams of polyazelaic polyanhydride; 15 grams of hexahydrophthalic anhydride; 210 grams of aluminatrihydrate; and 19 grams of finely divided alumina as thixotroping agent ($Al_2O_3$) of about 5 milli-microns to 30 milli-microns average particle diameter (sold by Degussa Inc., as aluminum oxide-C pigment), all mixed together at about 50° C. to provide a viscous coating composition. To 100 grams of this coating composition was admixed 2.5 grams of a photosensitive compound consisting of trimethylol propane triacrylate containing about 4 wt. % benzoin ether free radical photoinitiator (F.R.P.). This sample did not sag. Its track resistance (FTTT) was about 480 seconds, which is acceptable. Thickness, as indicated above was 0.1 inch. This material was also coated on aluminum panels, irradiated to gel, and cured, as described hereinbefore, at a coating thickness of 0.015 inch, no sagging was evident, and track resistance was over 600 minutes.

SAMPLE 2

In Sample 2 the same ingredients and amounts were used as in Sample 1, except that the amount of alumina-trihydrate was raised to 230 grams. This sample did not sag and its track resistance (FTTT) was over 600 seconds.

SAMPLE 3

In Sample 3 the same ingredients and amounts were used as in Sample 1, except that to 100 grams of the coating composition was added 5 grams of a photosensitive compound consisting of di methyl phthalate non-reactive plasticizer containing about 50 wt. % of triallyl sulfonium hexafluorophosphate cationic photoinitiator (C.P.). The sample did not sag. Its track resistance (FTTT) was about 540 seconds.

COMPARATIVE SAMPLE 4

In Comparative Sample 4, the same ingredients and amounts were used as in Sample 1, except that the amount of alumina-trihydrate was raised to 230 grams, and the amount of triacrylate based photosensitive compound was doubled, to 5.0 grams per 100 grams of coating composition. Here, while no sagging occurred, the track resistance (FTTT) was only 30 seconds, which is unacceptable for the insulating requirements of breaker feed tubes. Here, excess acrylate caused deterioration of electrical properties.

COMPARATIVE SAMPLE 5

In Comparative Sample 5, the same ingredients and amounts were used as in Sample 1, except that no photosensitive compound or U.V. gelation was used. While the track resistance (FTTT) was over 600 seconds, which is very good, some sagging occurred during the ½ hour gelation heating period at 135° C. The results are summarized in Table 1 below:

TABLE 1

| Sample | | U.V. Irradiation Time (seconds) | Sagging of the Sample | FTTT Track Resistance (seconds) |
|---|---|---|---|---|
| Coating Composition (parts by wt.) | Photosensitive Compound (parts by wt.) | | | |
| 1. (100) | (2.5 acrylic + F.R.P.) | 2 | no | 480 |
| 2. (100) | (2.5 acrylic + F.R.P.) | 2 | no | 600+ |
| 3. (100) | (5.0 non-reactive plasticizer + C.P.) | 2 | no | 540 |
| 4.* (100) | (5.0 acrylic + F.R.P.) | 2 | no | 30 |
| 5.* (100) | (0) | 0 | yes | 600+ |

*Comparative Sample
F.R.P. = free radical photoinitiator
C.P. = cationic photoinitiator As can be seen, acrylic resins cannot be added in as large quantities as some of the other useful carriers described hereinbefore. The use of photosensitive compounds is shown to dramatically improve sag resistance without any major degradation into rack resistance. The polyesters, acrylourethanes and polythiolenes, in the weight ranges described hereinbefore, would provide equally outstanding sag resistance and tracking properties as Samples 1 to 3.

We claim:

1. A photosensitive, sag resistant, arc and track resistant composition consisting essentially of the admixture of:
   (1) 100 parts by weight of a coating composition consisting essentially of:
      (A) 100 parts by weight of a cycloaliphatic epoxy resin,
      (B) about 30 to about 150 parts by weight of a flexibilizing agent for the epoxy resin, selected from the group consisting of polyazelaic polyanhydride, hexahydrophthalic anhydride and mixtures thereof,
      (C) about 150 to about 290 parts by weight of a filler promoting arc and track resistance, and
      (D) about 10 parts to about 75 parts by weight of $Al_2O_3$ as sole thixotroping agent, to which is added,
   (2) an amount of a photosensitive compound effective to initiate gelation within the admixture with ultraviolet light exposure where the photosensitive compound is selected from the group consisting of:
      (a) from about 1.0 part to about 4.0 parts by weight of acrylic resin, containing an effective amount of free radical photoinitiator,
      (b) from 1.0 part to 3.0 parts by weight of polyester resin, containing an effective amount of free radical photoinitiator,
      (c) from 1.0 part to 5.0 parts by weight of acrylourethane resin, containing an effective amount of free radical photoinitiator,
      (d) from 0.05 part to 8.0 parts by weight of polythiolene resin, containing an effective amount of free radical photoinitiator,
      (e) from about 1.0 part to about 15.0 parts by weight of a non-reactive plasticizer, containing an effective amount of cationic photoinitiator, and (f) from about 0.05 part to about 3.0 parts by weight of cationic photoinitiator;

said photosensitive, sag resistant composition being characterized as resistant to sag upon application to a surface, and as having crack resistance and chemical and physical resistance to arced $SF_6$ upon cure.

2. The sag resistant composition of claim 1, where the photosensitive compound is selected from the group consisting of non-reactive plasticizer containing an effective amount of a cationic photoinitiator, polyester resin containing an effective amount of a free radical photoinitiator, acrylourethane resin containing an effective amount of a free radical photoinitiator and polythiolene resin containing an effective amount of a free radical photoinitiator, the gelation is essentially instantaneous, to provide a chain matrix shell on the outside surface of the sag resistant composition to contain the rest of the resin, and the filler promoting arc and track resistance is selected from the group consisting of aluminum trihydrate, magnesite and mixtures thereof.

3. The sag resistant composition of claim 1, where the photosensitive compound is a cationic photoinitiator.

4. The sag resistant composition of claim 1, where the photosensitive compound is a non-reactive plasticizer selected from the group consisting of aromatic esters and aromatic phosphates containing from about 20 wt. % to about 70 wt. % of a cationic photoinitiator.

5. The sag resistant composition of claim 1, where the photosensitive compound is an acrylic resin containing from about 0.05 wt. % to about 15 wt. % of a free radical photoinitiator.

6. The sag resistant composition of claim 1, where the photosensitive compound is a polyester resin containing from about 0.05 wt. % to about 15 wt. % of a free radical photoinitiator.

7. The sag resistant composition of claim 1, where the photosensitive compound is an acrylourethane resin containing from about 0.05 wt. % to about 15 wt. % of a free radical photoinitiator.

8. The sag resistant composition of claim 1, where the photosensitive compound is a polythiolene resin containing from about 0.05 wt. % to about 15 wt. % of a free radical photoinitiator.

9. The sag resistant composition of claim 1, wherein the flexibilizing agent is a mixture of the polyazelaic polyanhydride and hexahydrophthalic anhydride.

10. The sag resistant composition of claim 1, characterized in that said cycloaliphatic epoxy resin is one having a backbone structure containing a pair of cycloaliphatic rings.

11. The sag resistant composition of claim 1, characterized in that said filler material is aluminum trihydrate and said $Al_2O_3$ thixotroping agent has a surface area of from about 40 sq.m/g to about 300 sq.m/g.

12. The sag resistant composition of claim 10, characterized in that said epoxy has a backbone structure that contains a bridge containing not more than about 5 atoms in the direct chain between said rings and the filler which promotes arc and track resistance in moist $SF_6$ gas has an average particle size of between about 0.5 micron and about 450 microns.

13. The sag resistant composition of claim 12, characterized in that said filler material is aluminum trihydrate and the sole thixotroping agent is $Al_2O_3$ having an average particle size of between about 0.0005 micron to about 0.10 micron diameter.

14. A feed tube made from the cured composition of claim 1.

15. An insulated article in an environment of $SF_6$ gas subject to arcing, said article having a flexible insulating surface adapted to be exposed to said gas, said insulating surface consisting essentially of the cured reaction product of the admixture of claim 1.

16. The insulated article of claim 15 where the photosensitive compound is selected from the group consisting of cationic photoinitiator, non-reactive plasticizer containing an effective amount of a cationic photoinitiator, acrylic resin containing an effective amount of a free radical phototinitiator, polyester resin containing an effective amount of a free radical photoinitiator, acrylourethane resin containing an effective amount of free radical photoinitiator and polythiolene resin containing an effective amount of free radical photoinitiator, the flexibilizing agent is selected from the group consisting of polyazelaic polyanhydride, hexahydrophthalic anhydride and mixtures thereof, the filler promoting arc and track resistance is selected from the group consisting of aluminum trihydrate magnesite and mixtures thereof, and the thixotroping agent is $Al_2O_3$.

17. The article of claim 15, wherein the flexibilizing agent is a mixture of the polyazelaic polyanhydride and hexahydrophthalic anhydride, and the filler is aluminum trihydrate.

18. The article of claim 15, wherein said cycloaliphatic epoxy resin is one having a backbone structure containing a pair of cycloaliphatic rings.

19. An article as defined in claim 15, characterized in that said article comprises a part of an extra-high-voltage circuit breaker.

20. An article as defined in claim 18, characterized in that said article is a feed tube.

* * * * *